(12) United States Patent
Shimada et al.

(10) Patent No.: US 6,776,631 B2
(45) Date of Patent: Aug. 17, 2004

(54) CARD ADAPTER

(75) Inventors: Tsutomu Shimada, Tokyo (JP);
Kaname Suwa, Kanagawa (JP);
Tsuguhide Sakata, Kanagawa (JP);
Atsushi Nishio, Ibaraki (JP); Takashi Kawasaki, Ibaraki (JP); Kazuhiro Okazaki, Ibaraki (JP)

(73) Assignee: Canon Kabushiki Kaisha Mitsumi Electric Co., Ltd. (JP)

( * ) Notice: Subject to any disclaimer, the term of this patent is extended or adjusted under 35 U.S.C. 154(b) by 0 days.

(21) Appl. No.: 10/208,421

(22) Filed: Jul. 30, 2002

(65) Prior Publication Data

US 2003/0022541 A1 Jan. 30, 2003

(30) Foreign Application Priority Data

Jul. 30, 2001 (JP) ........................................ 2001-230068

(51) Int. Cl.⁷ ............................................... H01R 13/62
(52) U.S. Cl. ........................ 439/159; 439/630; 439/310; 439/333
(58) Field of Search ............................... 439/159, 160, 439/310, 333, 745, 326, 328, 630; 361/798, 754

(56) References Cited

U.S. PATENT DOCUMENTS 5,316,488 A * 5/1994 Gardner et al. ............... 439/79
5,490,792 A * 2/1996 Sugita .......................... 439/159
5,643,001 A * 7/1997 Kaufman et al. ............ 439/159
5,778,521 A * 7/1998 Law et al. .................... 29/829
6,095,834 A   8/2000 Lai et al.
6,402,529 B2 * 6/2002 Saito et al. .................... 439/74

FOREIGN PATENT DOCUMENTS

| JP | 08203606 | 1/1995 |
|----|----------|--------|
| JP | 11-251019 | 2/1998 |
| JP | 2000277207 | 3/1999 |
| JP | 2000259782 | 12/1999 |

\* cited by examiner

*Primary Examiner*—P. Austin Bradley
*Assistant Examiner*—Edwin A. Leon
(74) *Attorney, Agent, or Firm*—Patents+TMS, P.C.

(57) ABSTRACT

A card adapter 1 is provided which may connect/disconnect a card-shaped electronic device and has a chassis 10, a push member 40 disposed in the chassis 10 for pushing a CF card 2, an eject lever 50 movably mounted with respect to the chassis 10, a link arm 60 pivotably mounted on the chassis 10 via a rotation axis 13, and the like. In the card adapter 1, one end of the link arm 60 is linked with the push member 40 via a first linking part 14, and the other end of the link arm 60 is linked with the eject lever 50 via a second linking part, whereby the movement of the eject lever 50 is transmitted to the push member 40 via the link arm 60. According to such a structure, the card adapter 1 can reliably and easily connect and disconnect the CF card 2.

33 Claims, 14 Drawing Sheets

CARD ADAPTER

BACKGROUND OF THE INVENTION

1. Field of the Invention

The present invention relates to a card adapter for electrically connecting electrical connecting portions of a card-shaped electronic device to contacts in a slot provided in a personal computer or the like for receiving another card-shaped electronic device which is manufactured in accordance with a different standard.

2. Description of the Prior Art

A card adapter has been conventionally used, for example, for electrically connecting contacts of a CF (Compact Flash) card which is a card-shaped electronic device smaller than a PC card to contacts in a slot provided in a personal computer for receiving a PC card.

FIG. 17 shows one example of this type of conventional card adapter disclosed in Japanese Laid-Open Patent Application 2000-259782.

The card adapter 80 shown in FIG. 17 has a chassis 81 made of resin or the like, a circuit board assembly 82 mounted on the chassis 81, and a pair of conducting plates 83, 83 provided on the upper and lower sides of the chassis 81, respectively.

The chassis 81 has a CF card receiving space 84 for receiving the CF card therein. The circuit board assembly 82 is provided with a first connector 85 to be electrically connected to the contacts (contact pins) provided in the slot for a PC card, a second connector 86 to be electrically connected to the contacts of the CF card, an eject button (eject lever) 87 and an eject arm 88 for ejecting the CF card received in the CF card receiving space 84.

The eject button 87 is disposed in the chassis 81 such that it can be moved along the longitudinal direction of the adapter. The eject arm 88 is pivotably mounted on the circuit board assembly 82 by means of a rotation axis 89. Further, the tip portion of the eject button 87 is linked with one end of the eject arm 88 through a connection 90.

When ejecting the CF card received in the CF card receiving space 84, eject operation is carried out by pushing the eject button 87 into the chassis 81. When the eject button 87 is pushed, the eject arm 88 is rotated about the rotation axis 89, and the other end portion thereof (which is an end portion opposite to the end portion linked with the elect button 87) is moved toward the inside of the CF card receiving space 84, and as a result, the CF card is disconnected from the card adapter 80 by the eject arm 88.

Further, the CF card is provided with grounding contact portions (not shown in the drawing) on the side surfaces thereof for discharging static electricity charged in the CF card, and the chassis 81 is also provided with an electrical path for discharging the static electricity from the grounding contact portion of the CF card to a grounding means of the slot for a PC card.

The electrical path is constructed from an elastic contacting part 91 which elastically contacts with the grounding contact portion of the CF card, a contact part 92 which electrically connects with the grounding means of the slot for a PC card, and the conducting plate 83 which electrically connects the elastic contacting part 91 and the contact part 92.

In the conventional adapter 80 described above, when ejecting the CF card from the CF card receiving space 84, the tip portion of the eject arm 88 pushes the end surface of the CF card as described above. However, since the tip portion of the eject arm 88 has a very small surface area, the eject arm 88 makes a point contact with the CF card, and as a result, the portion on the end surface of the CF card which makes a point contact with the eject arm 88 is easy to be abraded.

Further, the eject arm 88 is constructed so as to push only the left side portion on the end surface of the CF card in FIG. 17. As a result, when an eject operation is carried out, the left side portion of the CF card undergoes a larger displacement than the right side portion. Due to such difference in displacement between the left and right sides, the CF card is inclined in the CF card receiving space 84, and this may cause deformation in second connector terminals 93 connected to the CF card.

Furthermore, in the card adapter 80 having such a structure described above, in the case where the user pulls the CF card out of the card adapter 80 without using the eject button 87, the eject button 87 remains protruded to the outside of the card adapter 80, and this makes it easy for the eject button 87 to be broken by a lateral force.

Moreover, in the case where a Type II CF card is used, because the CF card and a card adapter to be inserted into the slot in a personal computer have the same thickness, it is not possible for the card adapter having such a structure described above to protect the eject arm 88 and the second connector 86 by covering them with the pair of conducting plates 83, thus resulting in the case where the components will be deformed when handled by the user.

SUMMARY OF THE INVENTION

In view of the problems described above, it is an object of the present invention to provide a card adapter which can reliably and easily connect and disconnect a card-shaped electronic device.

In order to achieve the object mentioned above, the present invention is directed to a card adapter for electrically connecting a plurality of electrical connecting portions of a card-shaped electronic device to a plurality of contacts provided in a slot for receiving another card-shaped electronic device which is manufactured in accordance with a different standard, comprising a first connector to be electrically connected to the contacts provided in the slot;

a second connector which is electrically connected to said first connector, said second connector being adapted to be connected to the electrical connecting portions of the card-shaped electronic device;

a chassis in which said first and second connectors are disposed;

a push member disposed in said chassis, said push member being movable between a first position in which the electrical connecting portions of the card-shaped electronic device can be connected to said second connector and a second position in which the electrical connecting portions of the card-shaped electronic device are disconnected from said second connector, and said push member being capable of pushing the card-shaped electronic device positioned at said first position toward said second position;

an eject lever movably mounted with respect to said chassis; and transmission means for transmitting the movement of said eject lever to said push member.

In the present invention described above, it is preferred that said transmission means is rotatably mounted on said chassis by means of a rotation axis, said transmission means being formed into a link arm having one end which is linked with said push member through a first linking part and the other end which is linked with said eject lever through a second linking part so that said push member is interconnected with said eject lever.

As described above, in the card adapter of the present invention, because the push member for pushing a card-shaped electronic device, the transmission member and the eject lever are linked through the first linking part and the second linking part, when one of these three members is displaced, the other two members are also moved. As a result, the card adapter of the present invention makes it possible to easily and reliably connect and disconnect a card-shaped electronic device.

In the present invention, it is also preferred that said push member has both side portions along its width direction, and said card adapter further comprises a biasing means which always bias said side portions of the push member, respectively, from said first position toward said second position, and said push member being adapted to be displaced from said first position toward said second position by the biasing force of said biasing means.

Further, it is also preferred that said rotation axis is integrally formed with said chassis.

In this case, it is preferred that the card adapter further comprises means for preventing said link arm from being disengaged with said rotation axis.

In the present invention, it is preferred that the card adapter further comprises means for restricting a rotation angle of said link arm.

Further, it is also preferred that said first linking part is arranged substantially in a central part of said push member in the width direction thereof.

Furthermore, it is also preferred that said first linking part comprises a projection disposed in either of said link arm or push member and an aperture disposed in the other.

In this case, it is preferred that said aperture is formed into a slit having a width substantially the same as the diameter of the projection so that the projection can move along the slit when the link arm is rotated.

Further, it is also preferred that said link arm is made of a metal plate, and said projection is integrally formed with said link arm by carrying out a burring process to a portion close to said one end of said link arm.

In the present invention, it is preferred that said second linking part comprises a linking protrusion in the other end of said link arm and a linking protrusion receiving hole formed in said eject lever so as to be engaged with said linking protrusion.

In this case, it is preferred that said linking protrusion is formed in the other end of said link arm through a step portion.

In the present invention, it is preferred that the card adapter further comprises means for retaining said push member at said second position when said push member has been moved to said second position.

In this case, it is preferred that said retaining means comprises an elastic member with a locking protrusion which is provided on said push member, and a locking aperture formed in said chassis, wherein said push member is retained at said second position by engagement between the locking protrusion and the locking aperture.

Further, it is also preferred that said locking protrusion is adapted to be shifted by abutment with a side surface of the card-shaped electronic device when the card-shaped electronic device is fitted to the card adapter, and the engagement between the locking protrusion and the locking aperture is disengaged so that said push member becomes displaceable toward the first position from said second position.

Furthermore, it is also preferred that said chassis includes a pair of arms which are spaced apart with each other and extend from portions of the chassis which are located at opposite sides of the second connector, respectively, to define a receiving space for said card-shaped electronic device, in which said eject lever is provided in one of these arms and said elastic member is provided in the other arm.

In the present invention, it is preferred that the push member is formed with a plurality of holes through which contact pins of the second connector protrude.

In this case, it is also preferred that said push member exposes the contact pins of the second connector at said first position and covers the contact pins at said second position.

In the present invention, it is preferred that the card-shaped electronic device is one selected from the group consisting of a semiconductor memory card, an interface card and a hard disk.

Further, it is also preferred that said eject lever is provided with a cap that covers the tip end of the eject lever, and said cap is formed with a guide portion which is in abutment with the side surface of the card-shaped electronic device when the card-shaped electronic device is to be connected to said second connector.

In this case, it is also preferred that the pair of arms includes a long arm and a short arm which is shorter than the long arm, and said eject lever is provided in the short arm.

In the present invention, it is preferred that the push member is adapted to push the card-shaped electronic device with a state that the push member is in a surface contact or multi point contact with the card-shaped electronic device at the both sides from the central portion thereof.

The above and further objects, structures and effects of the present invention will be more apparent from the following detailed description of the embodiments with reference to the appended drawings.

DETAILED DESCRIPTION OF THE INVENTION

Hereinbelow, preferred embodiments of a card adapter according to the present invention will be described in detail with reference to the appended drawings.

Figure 1:
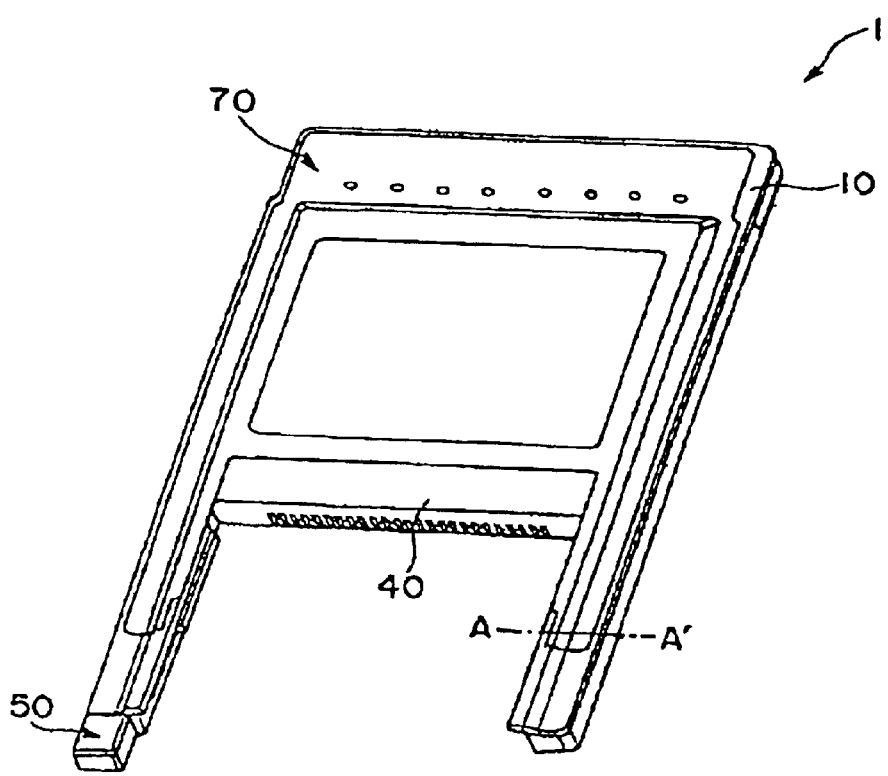
FIG. 1 is a perspective view which shows the overall structure of an embodiment of a card adapter according to the present invention.
Figure 2:
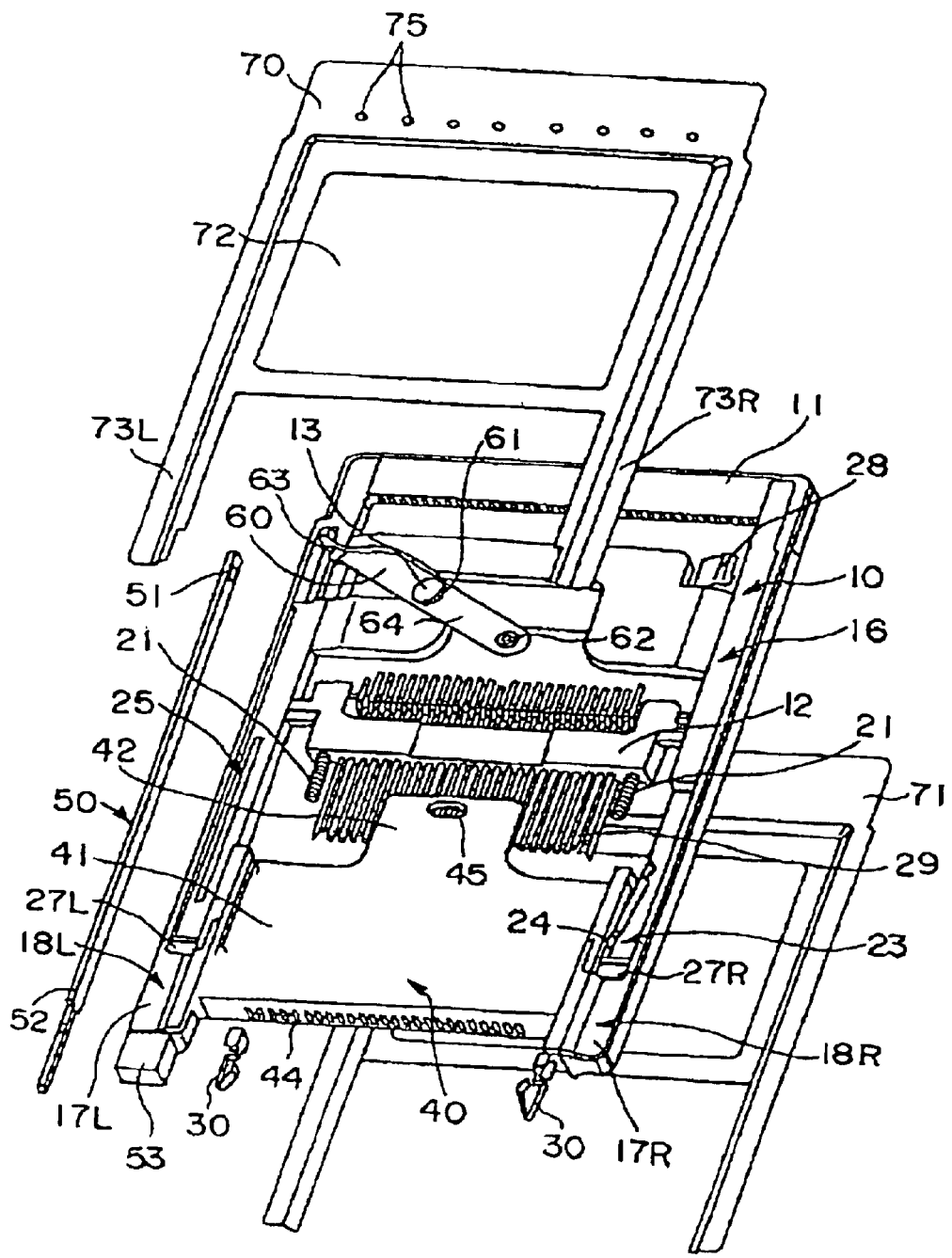
FIG. 2 is an exploded perspective view which shows the structure of the card adapter.
Figure 3:
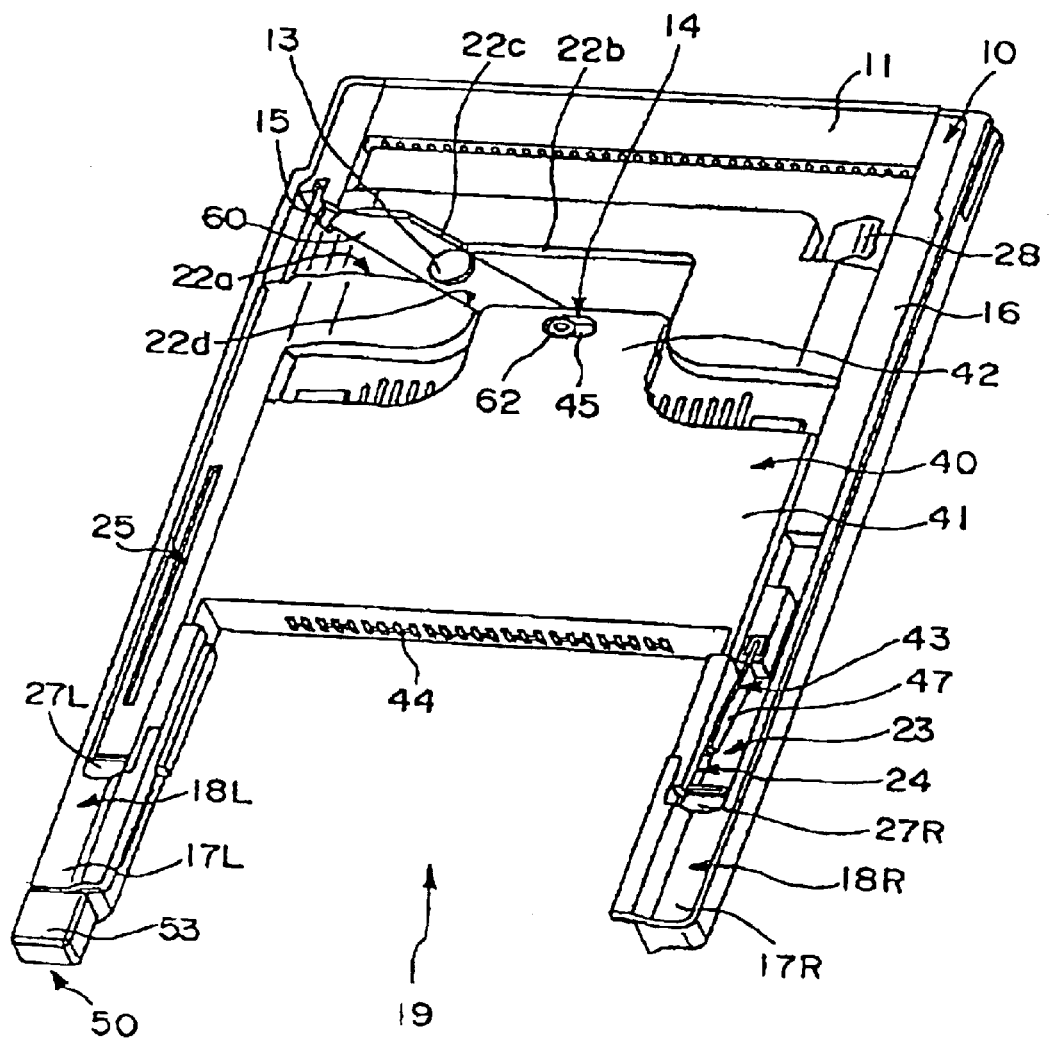
FIG. 3 is a perspective view which shows the card adapter from which conducting plates are removed with a CF card being disconnected therefrom.
Figure 4:
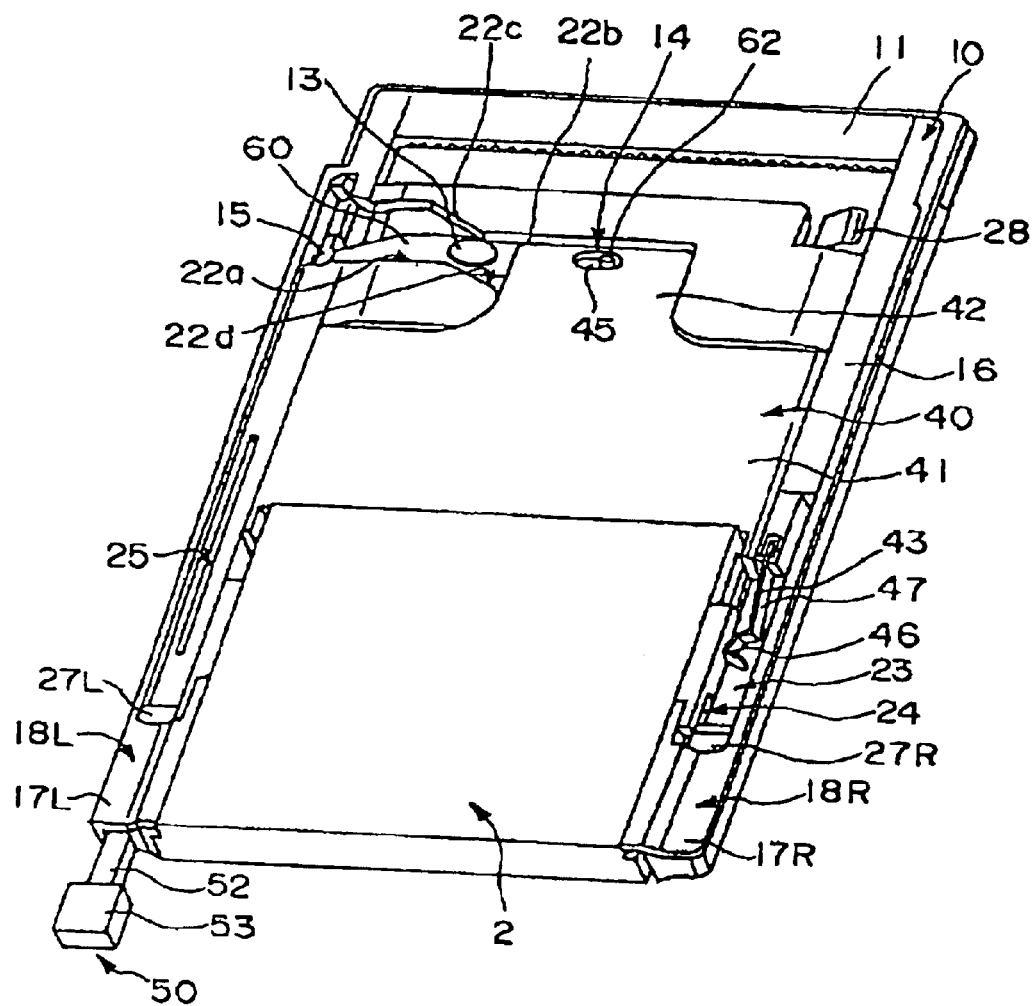
FIG. 4 is a perspective view of the card adapter from which the conducting plates are removed with the CF card being connected thereto.
Figure 5:
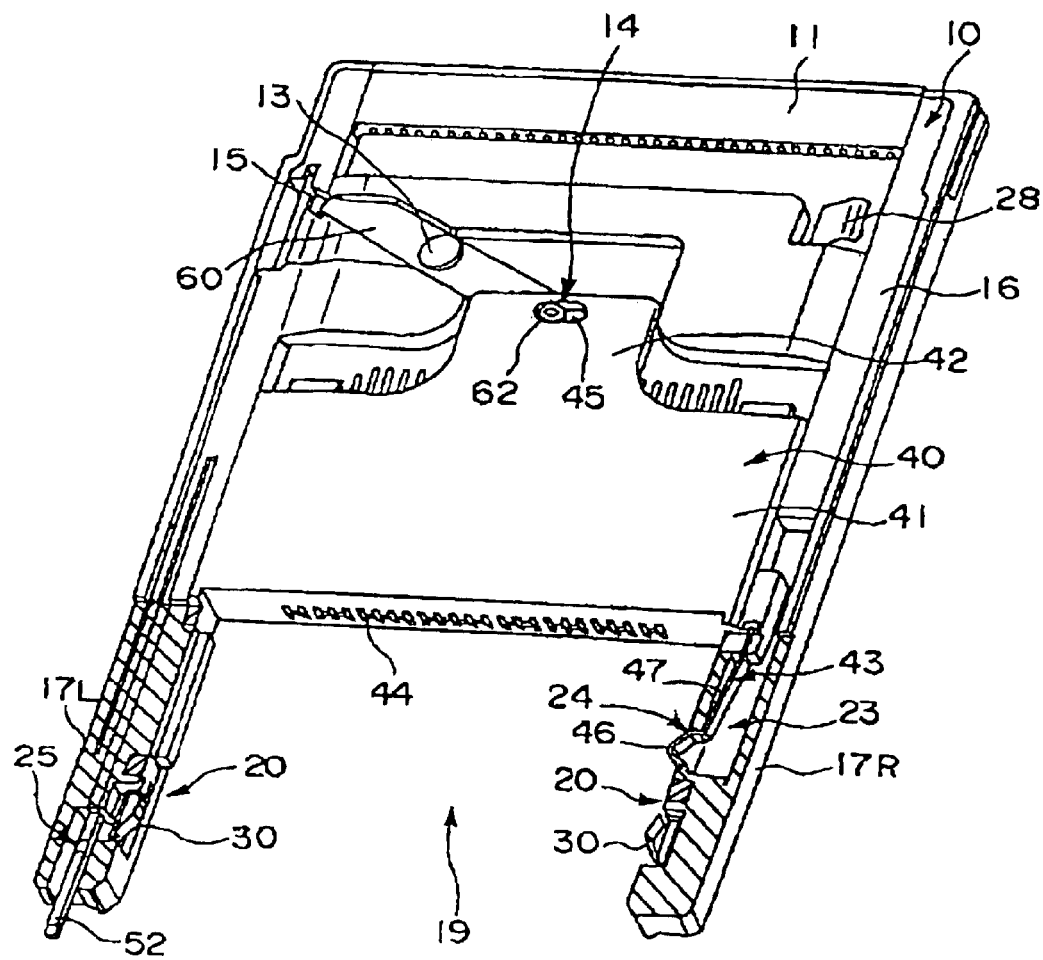
FIG. 5 is a partially cut away view which shows the internal structure of arms of the card adapter shown in FIG. 3.
Figure 6:
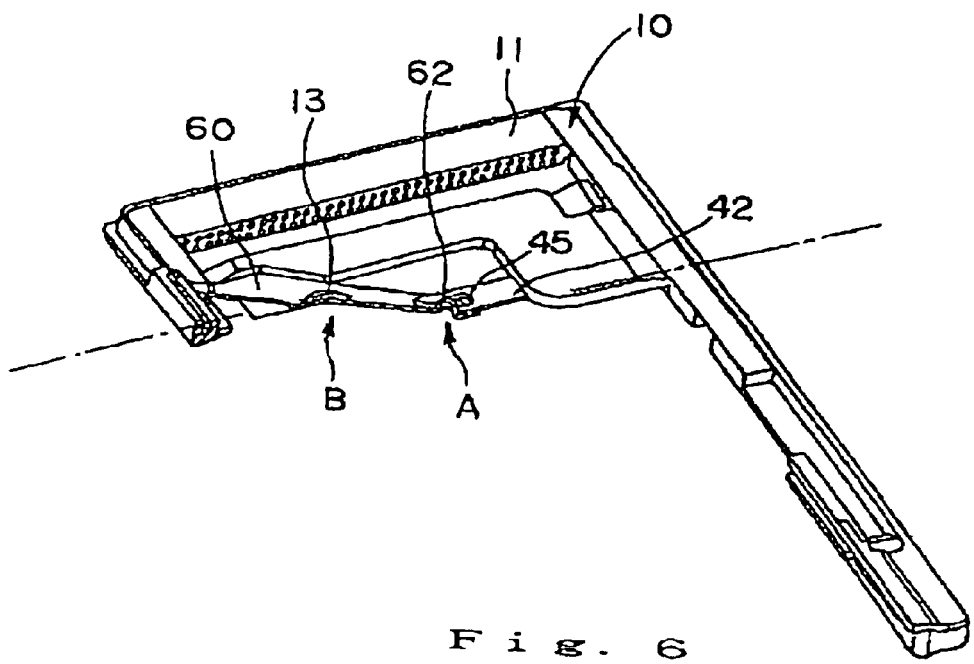
FIG. 6 is a partially cutout perspective view of the card adapter for showing a chassis, a push member and a link arm thereof.
Figure 7:
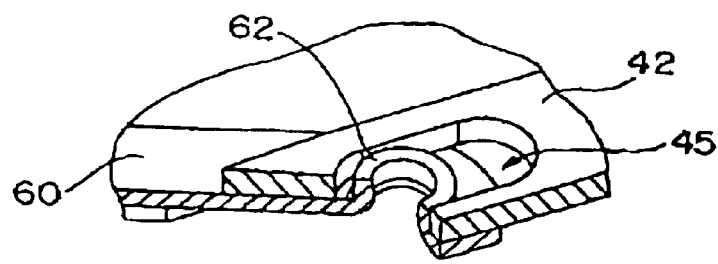
FIG. 7 is an enlarged view which shows the section of a first linking part indicated by an arrow A in FIG. 6.
Figure 8:
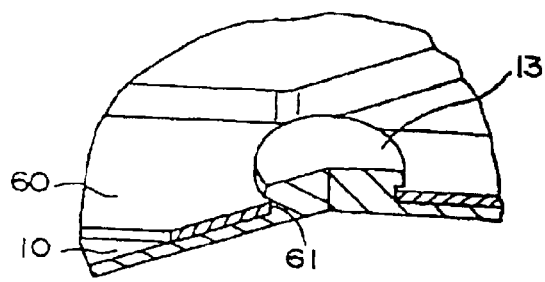
FIG. 8 is an enlarged view which shows the section of a rotation axis and the link arm indicated by an arrow B in FIG. 6.
Figures 9A, 9B:
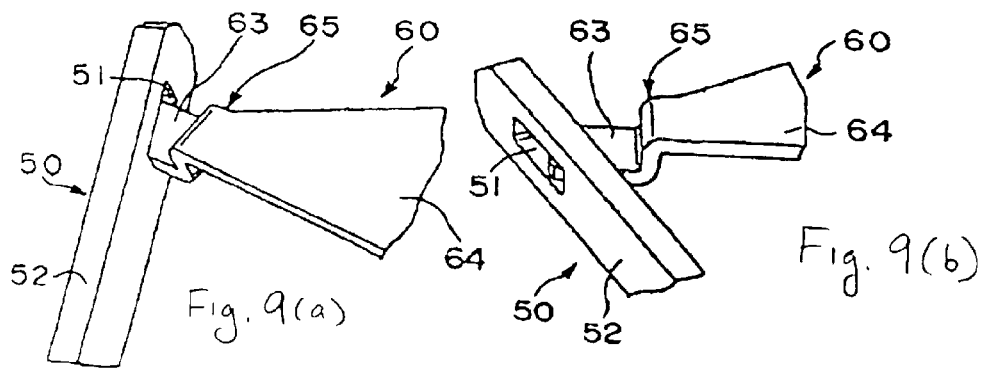
FIG. 9(a) is a perspective view looking from the lower right of FIG. 2, showing a second linking part of the card adapter.
FIG. 9(b) is a perspective view looking from the lower left of FIG. 2, showing the second linking part of the card adapter.
Figure 10A:
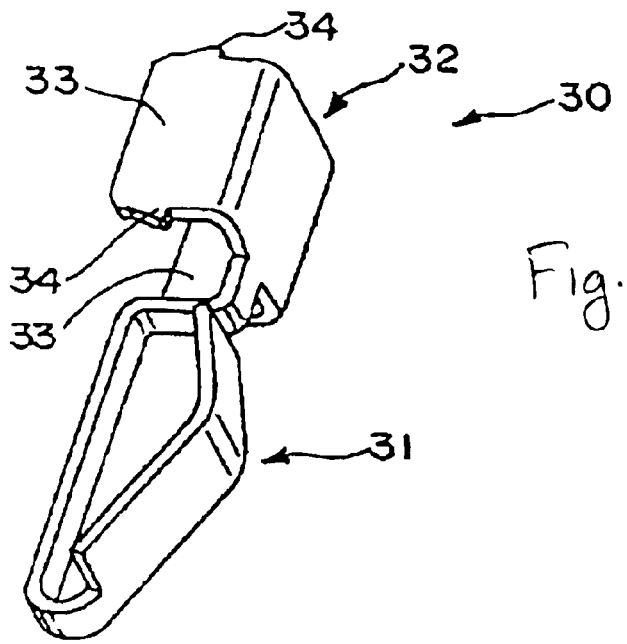
FIGS. 10(a) and (b) are perspective views which show a connecting member of the card adapter, respectively.
Figure 11:
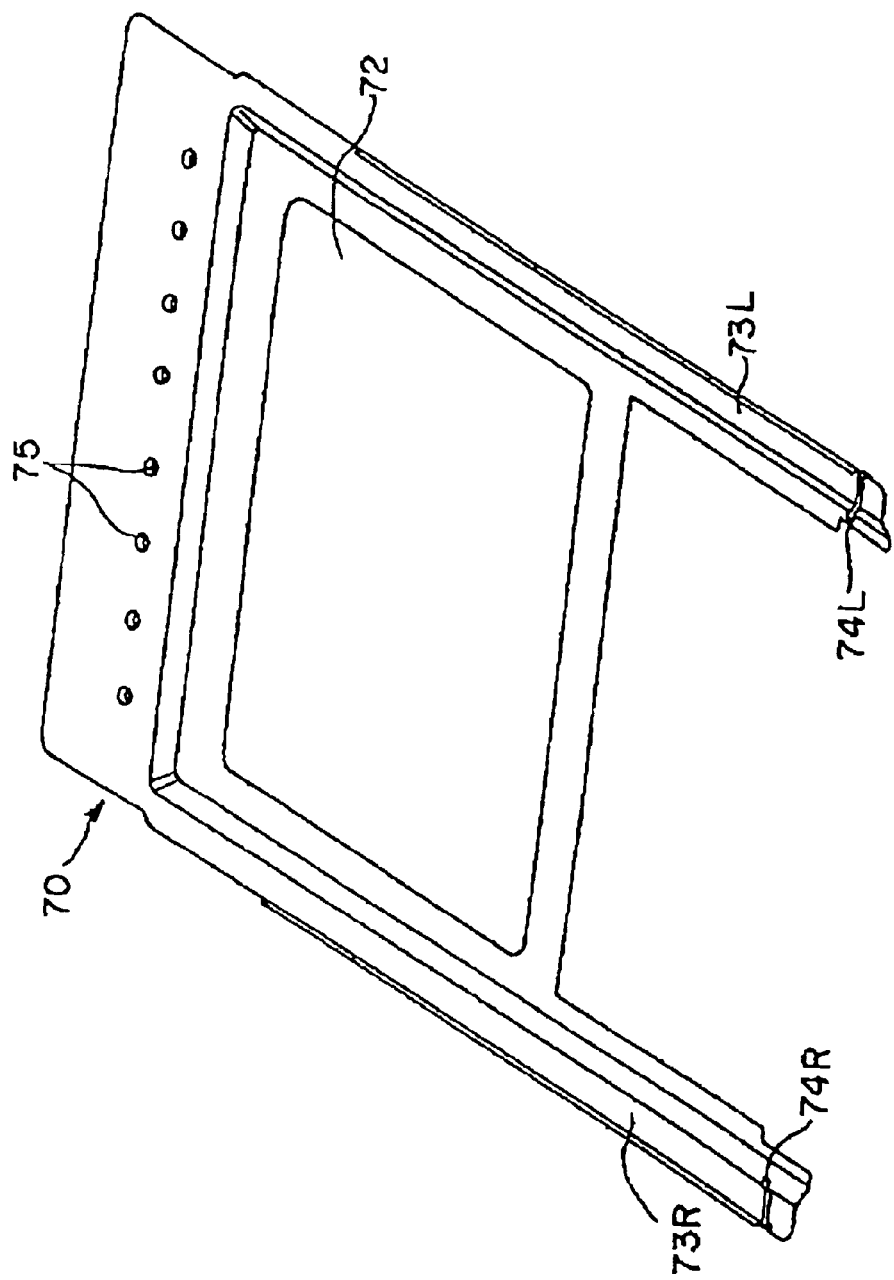
FIG. 11 is a perspective view looking from the back side, showing the conducting plate of the card adapter.
Figure 12A:
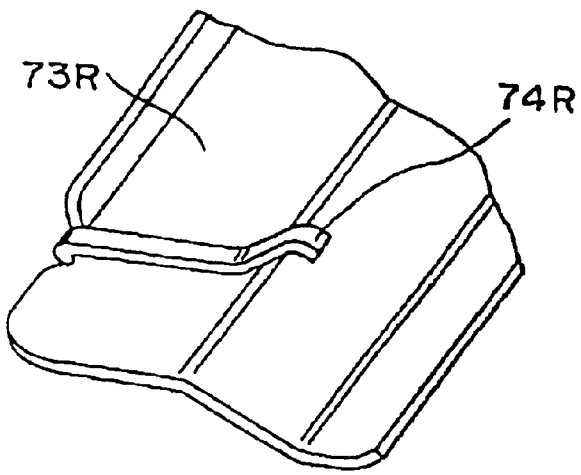
FIGS. 12(a) and (b) are enlarged views which show an elastic contact member and its periphery in FIG. 11, respectively.
Figure 13:
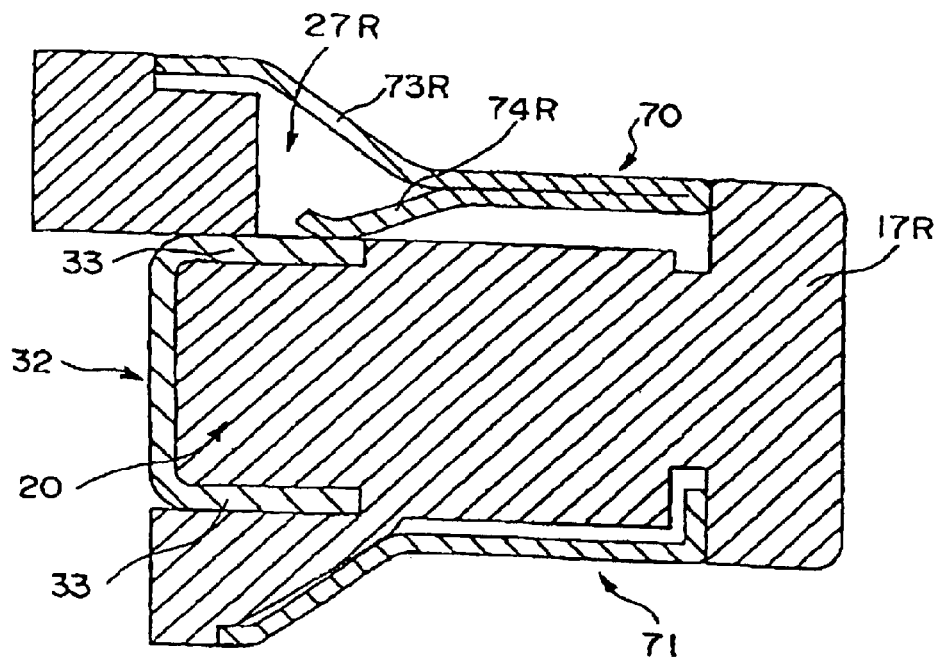
FIG. 13 is a sectional view taken along the A–A' line in FIG. 1.
Figure 14:
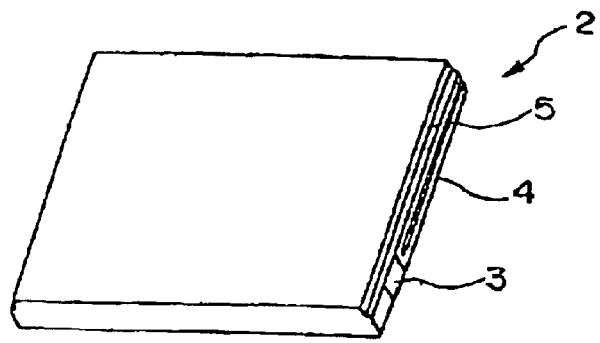
FIG. 14 is a perspective view which shows the overall structure of a CF card to be connected to the card adapter of the present invention.
Figure 15:
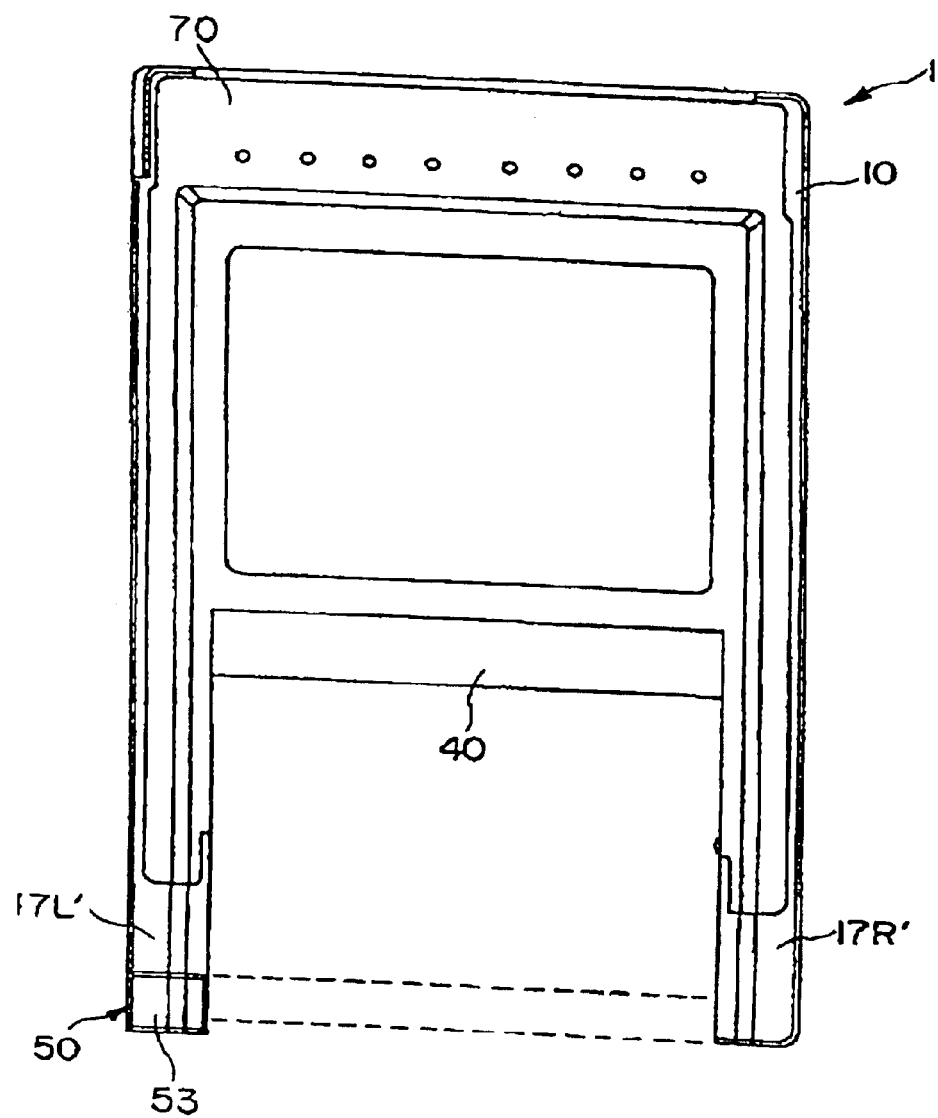
FIG. 15 is a plan view which shows another embodiment of the card adapter of the present invention in which the arms have a different structure.
Figure 16:
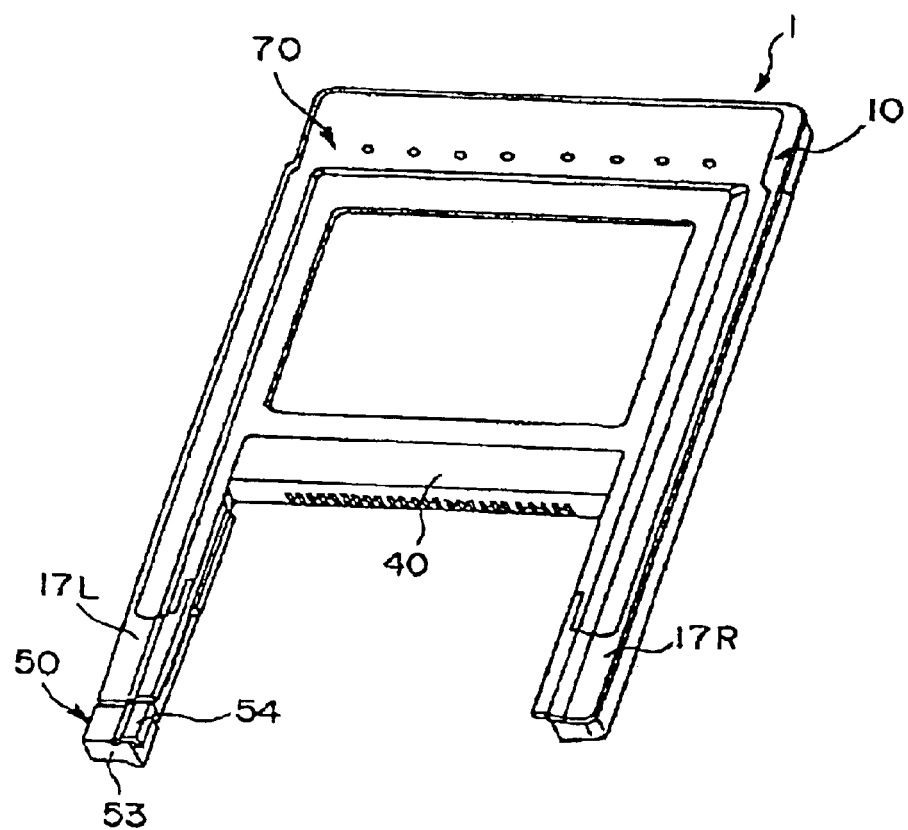
FIG. 16 is a perspective view which shows the overall structure of another embodiment of the card adapter in which a cap associated with an eject lever is modified.
Figure 17:
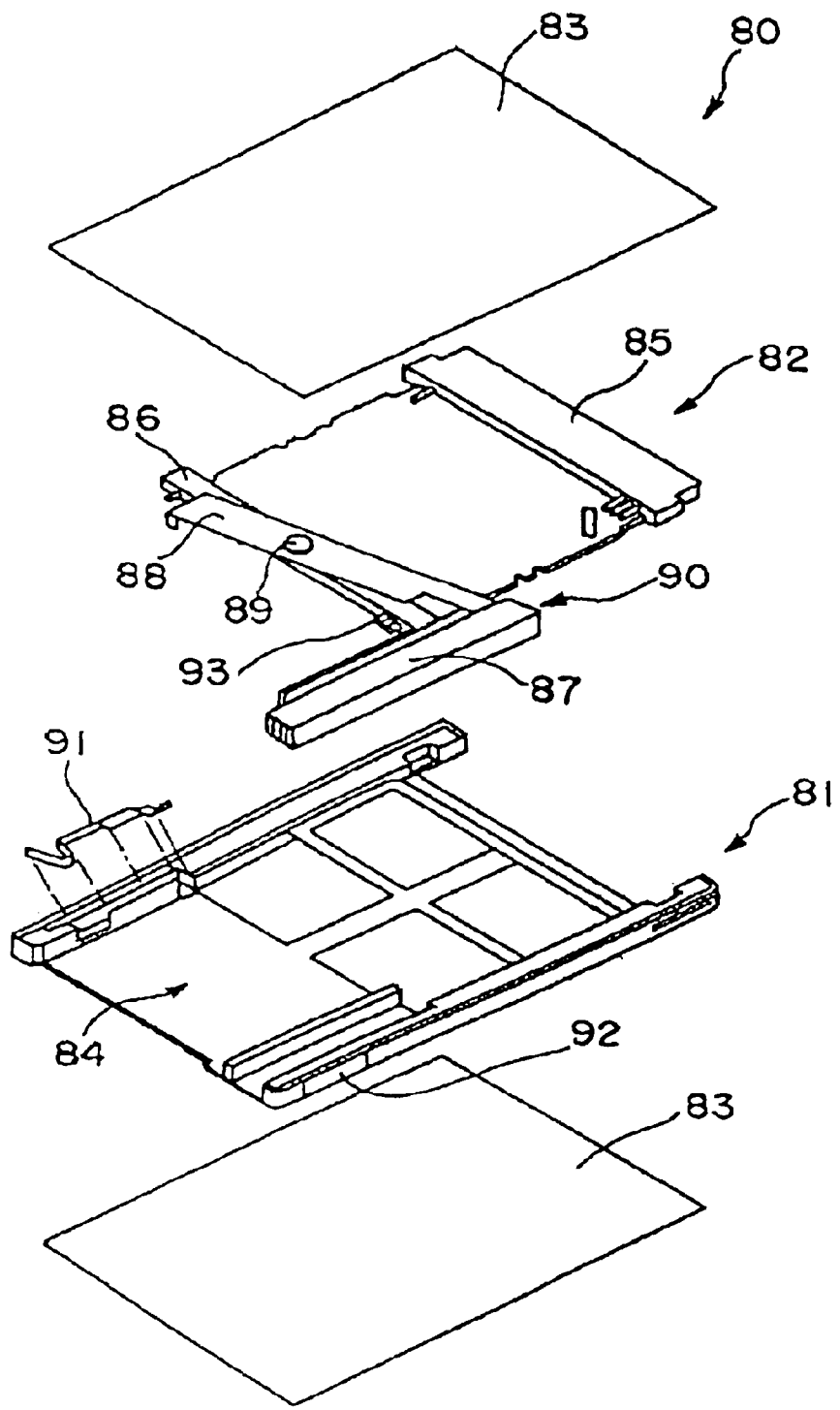
FIG. 17 is an exploded perspective view which shows a conventional card adapter.

FIG. 1 is a perspective view which shows the overall structure of an embodiment of the card adapter according to the present invention; FIG. 2 is an exploded perspective view which shows the structure of the card adapter; FIG. 3 is a perspective view which shows the card adapter from which conducting plates are removed with a CF card being disconnected therefrom; FIG. 4 is a perspective view of the card adapter from which the conducting plates are removed with the CF card being connected thereto; FIG. 5 is a partially cut away view which shows the internal structure of arms of the card adapter shown in FIG. 3; FIG. 6 is a partially cutout perspective view of the card adapter for showing a chassis, a push member and a link arm thereof; FIG. 7 is an enlarged view which shows the section of a first linking part indicated by an arrow A in FIG. 6; FIG. 8 is an enlarged view which shows the section of a rotation axis and the link arm indicated by an arrow B in FIG. 6; FIG. 9(a) is a perspective view looking from the lower right of FIG. 2, showing a second linking part of the card adapter; FIG. 9(b) is a perspective view looking from the lower left of FIG. 2, showing the second linking part of the card adapter; FIGS. 10(a) and (b) are perspective views which show a connecting member of the card adapter, respectively; FIG. 11 is a perspective view looking from the back side, showing the conducting plate of the card adapter; FIGS. 12(a) and (b) are enlarged views which show an elastic contact member and its periphery in FIG. 11, respectively; FIG. 13 is a sectional view taken along the A–A' line in FIG. 1; FIG. 14 is a perspective view which shows the overall structure of a CF card to be connected to the card adapter of the present invention; FIG. 15 is a plan view which shows another embodiment of the card adapter of the present invention in which the arms have a different structure; and FIG. 16 is a perspective view which shows the overall structure of another embodiment of the card adapter in which a cap associated with an eject lever is modified.

The card adapter according to the present invention is used, for example, for electrically connecting a plurality of electrical connecting portions of a card-shaped electronic device such as a CF (Compact Flash (which is a trade mark of SanDisk Corporation)) card, an interface card or a hard disk or the like to a plurality of contacts in a slot provided in a personal computer or the like for receiving another card-shaped electronic device which is manufactured in accordance with a different standard from the CF card or the like described above. In this regard, it is to be noted that the following description for the embodiments will be made with regard to the case where the card adapter according to the present invention is used for electrically connecting electrical connecting portions of a CF card to contacts (contact pins) provided in a slot for a PC card.

As shown in FIGS. 1 to 5, a card adapter 1 includes a first connector 11 to be electrically connected to the contacts provided in the slot for a PC card; a second connector 12 which is electrically connected to the first connector 11 and is adapted to be connected to the electrical connecting portions of a CF card 2: a chassis 10 in which the first and second connectors 11, 12 are disposed; a pair of conducting plates 70, 71 provided on the upper and lower sides of the chassis 10; and an ejecting mechanism used when the CF card 2 is ejected. The ejecting mechanism includes a push member 40, an eject lever 50 and a link arm 60. The push member 40 is disposed in the chassis 10, wherein the push member 40 is movable between a first position (see FIG. 4) in which the electrical connecting portions of the CF card 2 can be connected to the second connector 12 and a second position (see FIG. 3) in which the electrical connecting portions of the CF card 2 are disconnected from the second connector 12, and the push member 40 is capable of pushing the CF card 2 positioned at the first position toward the second position. The eject lever 50 is movably mounted with respect to the chassis 10. The link arm 60 is pivotably mounted on the chassis 10 via a rotation axis 13 to link the push member 40 and the eject lever 50, wherein one end of the link arm 60 is linked with the push member 40 via a first linking (coupling) part 14, and the other end is linked with the eject lever 50 via a second linking (coupling) part 15, whereby the link arm has the function of a transmission means for transmitting the movement of the eject lever 50 to the push member 40.

The chassis 10 is made of an insulating material such as a resin or the like and it is formed into a roughly rectangular shape. As shown in FIGS. 2 to 5, the chassis 10 includes a main body 16 in which the first connector 11 is positioned at one end and the second connector 12 is positioned at the other end, and a pair of arms 17L, 17R having a prescribed space therebetween that extend from the other end of the main body 16 provided with the second connector 12 to define a CF card receiving space 19 (see FIGS. 3 and 5) described below. As shown in FIGS. 2 to 5, the arm 17L is provided with an eject lever receiving space 25 in which the eject lever 50 is movably received, and the arm 17R is provided with an elastic member receiving space 23 which receives an elastic member 43 (described below) provided on the push member 40. Further, the tip portions in the extension direction of the arms 17L, 17R are provided with a pair of insulating grip portions 18L, 18R for insulating the pair of conducting plates 70, 71 from a user gripping the card adapter 1.

As shown in FIGS. 3 and 4, the insulating grip portions 18L, 18R are formed by exposing the insulating material of the tip portions in the extension direction of the pair of arms 17L, 17R. This exposing of the insulating material is carried out by removing a portion of each of the conducting plates 70, 71. By forming such structure, a user gripping the insulating grip portions 18L, 18R does not make contact with conductive members such as the conducting plates 70, 71 and connecting members 30 described below.

Further, the insulating grip portions 18L, 18R are preferably provided for a distance of at least 1 cm from the tip portions in the extension direction of the pair of arms 17L, 17R since these areas are normally gripped by the user when the card adapter 1 is mounted into the slot.

Then, by having this kind of structure, the card adapter 1 is insulated from static electricity from the user by the insulating grip portions 18L, 18R gripped by the user, and this makes it possible to prevent such static electricity from flowing to the slot and the CF card 2 through the conducting plates 70, 71 and the other conductive members.

Further, in the present embodiment, as shown in FIG. 3 and FIG. 4, the length of the arm 17L and the length of the arm 17R are roughly equal, and an eject lever cap 53 (described below) is positioned at the tip of the arm 17L. However, the present invention is not limited to this structure, and it is possible to be formed into the structure shown in FIG. 15 in which one of the arms is formed to be a long arm 17R', the other arm is formed to be a short arm 17L' having a shorter length than the long arm 17R', and the eject lever 50 is provided in the short arm 17L'.

In the case of the structure shown in FIG. 15, it is possible to reduce the amount of protrusion of the tip portion of the cap 53 of the eject lever 50 with respect to the tip portion of the long arm 17R' when the eject lever 50 is pulled into the inside of the chassis 10.

As shown in FIG. 14, the CF card 2 is a plate-like card-shaped electronic device having a roughly square shape, and electrical connecting portions (not shown in the drawing) which are adapted to make an electrical connection with contacts provided in the CF card receiving space 19 (contacts of the second connector) are provided in the end surface of the top side in the drawing. Further, both the left and right side end surfaces of the CF card 2 in the drawing, namely, the side surfaces positioned at the sides of the arms 17L, 17R when the CF card 2 is positioned in the CF card receiving space 19 of the chassis 10 are respectively provided with a grounding contact portion 3 for discharging the static electricity charged on the CF card 2 to connecting members 30 (described below) provided on both the left and right sides of the CF card receiving space 19, and a guide groove 4 and a guide concave portion 5 for guiding the CF card 2 when the CF card 2 is mounted in the CF card receiving space 19.

Further, as shown in FIG. 5, the arms 17L, 17R of the chassis 10 are provided with the connecting members 30 which are adapted to make an electrical connection with the grounding contact portions 3 of the CF card 2.

Figure 10B:
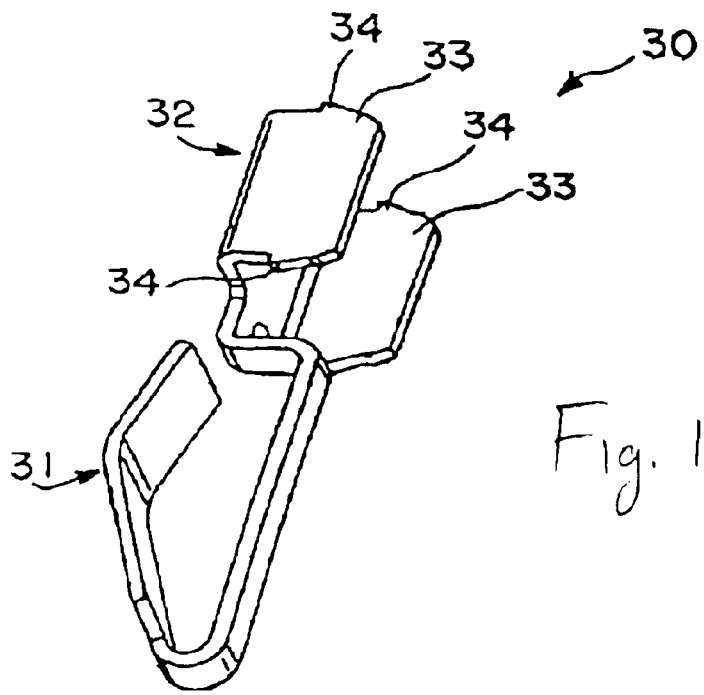

Each of the connecting members 30 is formed from a conductive material such as a metal material or the like. As shown in FIGS. 10(a) and 10(b), each connecting member 30 includes a mounting portion 32 for mounting the connecting member 30 to one of mounted portions 20, 20 provided on the chassis 10 and an elastic contact portion (in the form of a metal spring) 31 which makes elastic contact with the grounding contact portion 3 when the CF card 2 is received in the CF card receiving space 19.

Specifically, as shown in FIGS. 10(a) and 10(b), the mounting portion 32 of each connecting member 30 is formed into a shape having a roughly C-shaped cross section to have a pair of opposed top and bottom engagement parts 33, 33. Each of the engagement parts 33, 33 includes a pair of hooks 34, 34. These hooks 34 have the function of preventing the connecting member 30 from being disengaged from the mounted portion 20 when the connecting member 30 is mounted to the mounted portion 20.

Further, as shown in FIGS. 10(a) and 10(b), the elastic contact portion 31 is integrally formed with the mounting portion 32, and it includes a bent strip formed to have a roughly V-shaped cross section which acts as the metal spring.

Furthermore, as shown in FIG. 5 and FIG. 13, the mounted portions 20, 20 are respectively provided at two predetermined locations in the arms 17L, 17R of the chassis 10. Further, as is best shown in FIG. 13, each mounted portion 20 has a concave portion 27 which is formed in the top surface of each of the respective arms 17L, 17R.

The connecting member 30 having the above structure is mounted to the corresponding mounted portion 20 so that its top and bottom engagement parts 33, 33 of the mounting portion 32 hold the top and bottom surfaces of the arm, respectively, at the location of the concave portion 27 as shown in FIG. 13. When the connecting member 30 is mounted to the mounted portion 20 in this way, the elastic contact portion 31 of the connecting member 30 protrudes inwardly from the inner surface of the arm (17L or 17R) so that it can make elastic contact with the grounding contact portion 3 of the CF card 2 when the CF card 2 is received in the CF card receiving space 19. Further, in this state, as described below in more details, corresponding elastic contact members 74L, 74R provided on the conducting plate 70 can make contact with the top engagement parts 33 of the connecting members 30, respectively, so that the connecting member 30 is electrically connected to the conducting plate 70.

Further, as shown in FIG. 2, the chassis 10 is provided with a pair of biasing members 21, 21 which normally bias the push member 40 from the first position toward the second position. As shown in FIG. 2, the biasing members 21, 21 are compression coil springs provided on both ends of the second connector 12, and the push member 40 is biased and displaced from the first position to the second position by the biasing force of the biasing members 21, 21.

Further, as shown in FIGS. 2 to 5, the chassis 10 has the rotation axis 13 which supports the link arm 60 in a freely rotatable manner. As shown in FIG. 8, the rotation axis 13 is integrally formed with the chassis 10. Further, after the link arm 60 is mounted, the tip portion of the rotation axis 13 is formed into a mushroom shape having a diameter larger than the diameter of the rotation axis 13 by heat deformation or the like. Then, by forming such structure, it is possible to prevent the link arm 60 from disconnecting from the rotation axis 13.

Further, as shown in FIG. 3 and FIG. 4, the chassis 10 is provided with walls 22a to 22d in order to restrict the rotation angle of the link arm 60 around the rotation axis 13.

As shown in FIG. 4, the walls 22a and 22b are provided at positions corresponding to the positions of the lower side surface of the link arm 60 in the left side of the drawing from the rotation axis 13, and the upper side surface of the link arm 60 in the right side of the drawing from the rotation axis 13 when the push member 40 is positioned at the first position.

Further, as shown in FIG. 3, the walls 22c and 22d are provided at positions corresponding to the positions of the upper side surface of the link arm 60 in the left side of the drawing from the rotation axis 13, and the lower side surface of the link arm 60 in the right side of the drawing from the rotation axis 13 when the push member 40 is positioned at the second position.

Now, when an attempt is made to rotate the link arm 60 beyond a required angle, the side portions of the link arm 60 (that is, the upper side surface of the link arm 60 in the left side from the rotation axis 13 and the lower side surface of the link arm 60 in the right side from the rotation axis 13) come into abutment with the walls 22c and 22d, whereby the rotation of the link arm 60 is restricted. Then, by restricting the rotation of the link arm 60 in this way, the displacement of each end portion of the link arm 60, namely, the displacement of the push member 40 and the eject lever 50 respectively linked to the first linking part 14 and the second linking part 15 is also restricted.

The push member 40 has a function which pushes the CF card 2, and a function which protects contact pins 29 of the second connector 12 when the CF card 2 is removed.

The push member 40 is formed from an insulating material such as resin or the like in the same manner as the chassis 10, and as shown in FIGS. 2 to 5, the push member 40 includes a contact pin covering portion 41 for covering the contact pins 29 of the second connector 12, a protruding portion 42 which extends from the end portion of the covering portion 41 at the side of the first connector 11 (which is shown in the upper side of the covering portion 41 in the drawings), and the elastic member 43 provided on the end portion of the covering portion 41 on the right side in the drawings.

As shown in FIG. 2 and FIG. 3, the covering portion 41 is formed roughly in the shape of a flat box, and includes protrusion holes 44 formed in the end surface at the side of the CF card receiving space 19 to enable the protrusion of the contact pins 29 of the second connector 12.

Further, as shown in FIGS. 2 to 5, the protruding portion 42 extends from roughly the center of the covering portion 41 in the width direction thereof toward the first connector 11. Further, an aperture 45 which engages with a projection 62 (described below) of the link arm 60 is provided in a roughly central portion of the protruding portion 42 in the width direction thereof. The aperture 45 is formed into the shape of a slit which has a width roughly the same as (slightly larger than) the diameter of the projection 62 (described below) disposed on the end portion of the link arm 60 so that the projection 62 can move along the aperture 45 when the link arm 60 is rotated.

Then, by adopting such a structure, it is possible to provide a prescribed play between the projection 62 and the aperture 45, and it becomes possible to ideally convert the rotational movement of the link arm 60 into the reciprocal movement of the push member 40.

Furthermore, in the present embodiment, the engaging part of the projection 62 and the aperture 45 is referred to as the first linking part 14. Further, in the present embodiment, the projection 62 is disposed on the link arm 60, and the aperture 45 is disposed in the push member 40, but the present invention is not limited to this arrangement. It is also possible to provide the projection on the push member 40, and provide the aperture in the link arm 60, and in the case where such structure is adopted, it is possible to achieve the same advantages as the present embodiment.

As described above, in the present embodiment, the first linking part 14 is positioned in roughly the central portion of the push member 40 in the width direction thereof. Accordingly, when the push member 40 is displaced, there is no difference in the displacements of the end portions of the CF card 2 in the width direction thereof like that which occurs in the prior art card adapter 80 described above, so that it becomes possible to prevent deformation of the contact pins 29 of the second connector 12 when the push member 40 is displaced.

The elastic member 43 is made from a metal material, and as shown in FIG. 4 and FIG. 5, the elastic member 43 includes a locking protrusion 46 which locks with a locking aperture 24 formed in the elastic member receiving space 23 of the chassis 10, and a flat spring portion 47 which makes it possible to displace the locking protrusion 46. The elastic member 43 having the above structure is fixed to the end portion of the push member 40 (which is shown in the right side of the drawings), and is received in the elastic member receiving space 23 provided in the arm 17R of the chassis 10.

As shown in FIG. 3 and FIG. 5, when the push member 40 reaches the second position, the locking protrusion 46 locks with the locking aperture 24 of the chassis 10. Then, when an attempt is made to displace the push member 40 from the second position toward the first position, the locking surface of the locking protrusion 46 makes contact with the locking surface of the locking aperture 24, whereby the push member 40 is kept at the second position.

Further, as shown in FIG. 4, when the CF card 2 is mounted in the CF card receiving space 19, the locking protrusion 46 makes contact with a side surface of the CF card 2, and is displaced to the right side in the drawings, namely, into the inside of the arm 17R. This displacement disengages the lock between the locking protrusion 46 and the locking aperture 24, thereby making it possible to displace the push member 40 from the second position to the first position.

As described above, the push member 40 is movable between the first position shown in FIG. 4, namely, the position where the CF card 2 is received in the CF card receiving space 19 under the state that the electrical connecting portions of the CF card 2 are connected to the contact pins of the second connector 12, and the second position shown in FIG. 3, namely, the position where the electrical connecting portions of the CF card 2 can be disconnected from the second connector 12. When the push member 40 is moved from the first position toward the second position, the push member 40 is capable of pushing the CF card 2 positioned at the first position toward the second position. According to the movement of the push member 40, the protrusion holes 44 of the covering portion 41 of the push member 40 cover the contact pins 29 (see FIG. 2) of the second connector 12 so that the contact pins 29 are held inside the covering portion 41 of the push member 40, whereby the contact pins 29 are protected by the covering portion 41. In other words, in accordance with the movement of the push member 40, the contact pins 29 of the second connector 12 are pulled out of the electrical connecting portions of the CF card 2.

Further, as seen from the drawings, the push member 40 is constructed so as to push the CF card 2 by surface contact or multiple point contact along the both sides of the center of the push member 40 in the width direction thereof (although at least two point contact occurs in the both sides of the center position, many contact points are preferred). Accordingly, contact does not occur only at a single point like the tip portion of the eject arm 88 of the prior art card adapter 80 described above. This makes it possible to prevent abrasion of the contact portion of the CF card 2. Further, because the surface contact or multiple point contact described above occurs in the both sides of the center position of the push member 40, it is possible to prevent inclination of the CF card 2 inside the CF card receiving space 19.

The link arm 60 is formed from a metal material, and as shown in FIG. 2 and FIG. 8, the link arm 60 is provided with an axis hole 61 in roughly the center thereof for support by the rotation axis 13 provided on the chassis 10. Further, the projection 62 is disposed on the right side end portion of the link arm 60 in the drawings, and a linking protrusion 63 is provided on the left side end portion of the link arm 60 in the drawings. In the present embodiment, the portion of the link arm 60 excluding the linking protrusion 63 is referred to as a link arm body 64 for convenience' sake, and the engagement part of the linking protrusion 63 and a linking protrusion receiving hole 51 is referred to as the second linking part 15.

As shown in FIG. 6 and FIG. 7, the projection 62 is integrally formed with the link arm 60 (which is formed from a metal material) by carrying out a burring process or the like on the right side end portion of the link arm 60 in the drawings. In the present embodiment, by integrally forming the projection 62 with the link arm 60 by a burring process in this way, the processes carried out when manufacturing the link arm 60 are made more efficient.

As shown in FIGS. 9(*a*) and 9(*b*), the linking protrusion 63 is formed to have a roughly rectangular plate-like shape, and is integrally formed with the left side end portion of the link arm body 64 in the drawings via a step portion 65. The step portion 65 has a function which adjusts the position of the linking protrusion 63 with respect to the linking protrusion receiving hole 51 (described below) provided in the eject lever 50, and the linking protrusion 63 and the link arm body 64 are integrally formed via the step portion 65. Accordingly, when the link arm 60 is mounted to the chassis 10, the operation which engages the linking protrusion 63 to the linking protrusion receiving hole 51 of the eject lever 50 is made more efficient.

As shown in FIG. 2, the eject lever 50 is constructed from a rod-shaped eject rod 52 which is received in the eject lever receiving space 25 provided in the chassis 10, and the cap 53 (made from an insulating resin) which covers the tip end portion of the eject rod 52 (which is shown in the lower side in the drawings).

Further, in the present embodiment, the cap 53 is formed to have a roughly rectangular parallelepiped shape, but the present invention is not limited to this. As shown in FIG. 16, the cap 53 may be formed to have roughly the same cross-sectional shape as the arm 17L, and it is possible to provide the inner side surface of the cap 53 (which is shown in the right side in the drawings) with a guide portion (protruding member) 54 which extends in the extension direction of the arm 17L.

When the CF card 2 is mounted in the CF card receiving space 19 of the chassis 10, the guide portion 54 is adapted to engage with the guide concave portion 5 provided on the side surface of the CF card 2 in order to guide the CF card 2.

By providing the guide portion 54, when the CF card 2 is to be mounted into the card adapter 1 while the card adapter 1 is in a mounted state inside a slot (not shown in the drawings) for a PC card, the guide concave portion 5 of the CF card 2 is guided by the guide portion 54, so that the CF card 2 can be mounted smoothly.

As shown in FIG. 2 and FIGS. 9(*a*) and 9(*b*), the linking protrusion receiving hole 51 which receives the linking protrusion 63 of the link arm 60 is provided in the base end of the eject rod 52. As shown in FIGS. 9(*a*) and 9(*b*), the linking protrusion receiving hole 51 is formed into a through hole having a roughly rectangular cross section which passes through the eject rod 52 from the right side surface into the left side surface. The width of the linking protrusion receiving hole 51 is designed to be larger than the width of the linking protrusion 63.

In this way, by setting the width of the linking protrusion receiving hole 51 to be larger than the width of the linking protrusion 63, it is possible to provide a prescribed play between the linking protrusion 63 and the linking protrusion receiving hole 51. This makes it possible to ideally convert the rotational motion of the link arm 60 into the reciprocal motion of the eject lever 50.

The conducting plates 70, 71 are formed from a metal material as shown in FIG. 2 and FIG. 11, each conducting plate is constructed from a roughly rectangular main body cover portion 72 which protects the main body 16 of the chassis 10, and a pair of arm cover portions 73L, 73R which extend from both side ends of the edge of the main body cover portion 72 (which is shown in the lower side in the drawings).

When mounted to the chassis 10, the main body cover portion 72 makes contact with a connecting plate 28 provided on the upper portion of the chassis 10. The connecting plate 28 is electrically connected to at least one of the terminal pins of the first connector 11, and has a function which discharges static electricity from the main body cover portion 72 to a grounding terminal of the slot.

Figure 12B:
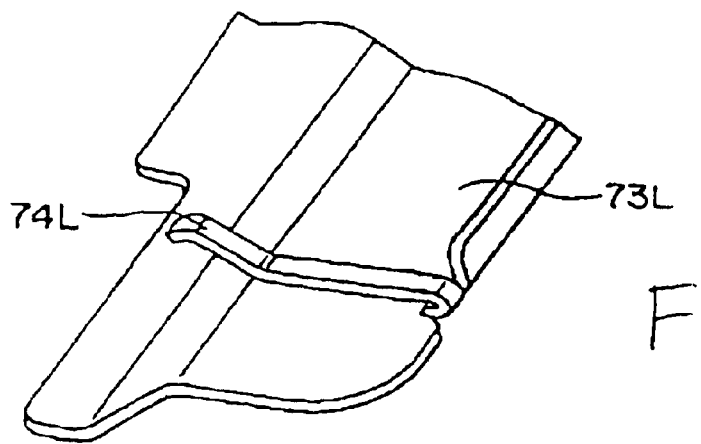

Further, as shown in FIG. 11 and FIGS. 12(*a*) and 12(*b*), on the underside of the pair of arm cover portions 73L, 73R of the conducting plate 70, there are integrally formed with long and narrow plate-shaped elastic contact members 74L, 74R, respectively, so as to extend from the outside end portions of the arm cover portions 73L, 73R toward the inside. As shown in FIG. 13, when the conducting plate 70 is mounted to the chassis 10, the elastic contact members 74L, 74R make elastic contact with the engagement parts 33 of the connecting members 30 provided on the chassis 10 to make an electrical connection between the connecting members 30 and the conducting plate 70.

Further, the conducting plate 70 is provided with a plurality of connecting protrusions 75 which are adapted to make a connection with a grounding means of a slot such as a plurality of tongue members or the like positioned in the upper side of the slot.

As shown in FIG. 2 and FIG. 11, the connecting protrusions 75 are provided on the conducting plate 70 near the end portion of the first connector 11, and each connecting protrusion 75 is a protrusion formed in the shape of a hemisphere. The connecting protrusions 75 are adapted to make an electrical connection with the grounding means of the slot after the first connector 11 is electrically connected to the contacts of the slot. Therefore, in the case where the static electricity from the conducting plate 70 can not be discharged from the first connector 11 due to a break in the discharge path or the like, the connecting protrusions 75 are connected to the grounding means of the slot so that the static electricity from the conducting plate 70 is discharged to the grounding means of the slot. Further, because the connecting protrusions 75 make contact with the grounding means of the slot at many points, the grounding resistance of the main body cover portion 72 is lowered, and this makes it possible to shield the outside from undesired radiation of electromagnetic waves generated inside the device.

In this way, in the present embodiment, first, static electricity from the CF card 2 is discharged to the grounding terminal of the slot through the connecting members 30, the conducting plate 70, the connecting plate 28 and the first connector 11, and they form a first discharge path. Further, in the case where this first discharge path is broken for some reason, the static electricity from the CF card 2 is discharged to the grounding means in the upper side of the slot through a second discharge path, namely, through the connecting members 30 and the conducting plate 70 (connecting protrusions 75). In this way, by providing these two separate discharge paths for discharging the static electricity from the CF card 2, it becomes possible to discharge the static electricity from the CF card 2 to the grounding means of the slot more reliably.

Accordingly, in the structure described above, because there is no need to provide any members equivalent to the contact member 92 of the prior art card adapter 80 described above which are arranged on the side portion of the chassis 81 to make contact with the conducting plate 83, it becomes possible to reliably insulate the conducting plate 70 from a user gripping the card adapter 1. As a result, in the case where the user's body is charged with a large amount of static electricity especially during the winter season or the like, this static electricity is not discharged to the slot or the CF card 2 through the conducting plate 70, so that there is no risk of the internal electronic circuits malfunctioning or being damaged by such static electricity.

As described above, in the card adapter 1 of the present invention, the push member 40, the link arm 60 and the eject lever 50 are linked through the first linking part 14 and the second linking part 15 so that when one of these three members is displaced, the other two members are also moved. In addition, when the CF card 2 is removed from the card adapter 1, namely, when the push member 40 is displaced from the first position to the second position, the eject lever 50 is reliably pulled inside the chassis 10 in accordance with the displacement of the push member 40.

As a result, even in the case where the CF card 2 is removed from the card adapter 1 by hand without using the eject lever 50, the eject lever 50 is held inside the chassis 10. Therefore, it is possible to prevent the eject lever 50 from being damaged when the CF card 2 is not mounted in the card adapter 1.

Further, in the structure described above, the rotation axis 13 is integrally formed with the chassis 10, and after the rotation axis 13 is inserted through the axis hole 61 of the link arm 60, the top end portion thereof is processed to have a larger diameter than the diameter of the rotation axis 13, thereby preventing the link arm 60 from detaching from the rotation axis 13.

Further, in the structure described above, since the walls 22a to 22d are provided as restricting means for restricting the rotation angle of the link arm 60 on the chassis 10, it is possible to prevent the link arm 60 from rotating more than necessary. Further, because of this restricted rotation of the link arm 60, the push member 40 and the eject lever 50 are prevented from protruding out of the chassis 10 more than necessary.

Further, in the structure described above, the first linking part 14 is constructed by the projection 62 disposed on one end of the link arm 60, and the aperture 45 formed in the push member 40 to engage with the projection 62, wherein the aperture 45 is positioned roughly in a central portion of the push member 40 in the width direction thereof. Accordingly, it is possible to prevent inclination of the push member 40 when the push member 40 is displaced.

Further, in the structure described above, the link arm 60 is formed from a metal material, and the projection 62 is integrally formed with the link arm 60 by a burring process. Accordingly, the manufacturing process of the link arm 60 can be simplified.

Further, in the structure described above, the aperture 45 is formed into a slit having a width roughly the same as the diameter of the projection 62, and the projection 62 is capable of moving along the aperture 45 when the link arm 60 is rotated. Accordingly, it is possible to ideally convert the rotational motion of the link arm 60 into the reciprocal motion of the push member 40.

Further, in the structure described above, the second linking part 15 is constructed by the linking protrusion 63 provided on the other end of the link arm 60 and the linking protrusion receiving hole 51 provided in the eject lever 50 to engage with the linking protrusion 63, so that the rotational motion of the link arm 60 is converted into the reciprocal motion of the eject lever 50. The linking protrusion 63 is integrally formed with the link arm body 64 through the step portion 65 for adjusting the position of the linking protrusion 63 with respect to the linking protrusion receiving hole 51. Accordingly, it is possible to simplify the operation of attaching the link arm 60 to the eject lever 50.

Further, in the structure described above, when the push member 40 reaches the second position, the holding means retains the push member 40 at the second position. This holding means is constructed from the elastic member 43 with the locking protrusion 46 which is provided on the push member 40, and the locking aperture 24 formed in the chassis 10, wherein the locking protrusion 46 locks with the locking aperture 24 to reliably retain the push member 40 at the second position. Further, the locking protrusion 46 is constructed to undergo displacement in contact with the side surface of the CF card 2 when the CF card 2 is mounted, and the lock between the locking protrusion 46 and the locking aperture 24 is disengaged by such displacement, thereby making it possible to displace the push member 40 from the second position to the first position. Accordingly, the push member 40 can be constructed to allow for displacement only when the CF card 2 is mounted.

Further, in the structure described above, the chassis 10 includes the pair of arms 17L, 17R having a prescribed space therebetween that extend from portions of the chassis 10 which are located at opposite sides of the second connector 12, respectively, to define the CF card receiving space 19, wherein one of the arms 17L, 17R is provided with the eject lever 50, with the other being provided with the elastic member 43. Accordingly, it becomes possible to efficiently utilize the limited space inside the chassis 10.

Further, in the structure described above, the pair of arms 17L, 17R of the chassis 10 are provided with the pair of insulating grip portions 18L, 18R which insulate the pair of conducting plates 70, 71 covering the both surfaces of the chassis 10 from a user gripping the card adapter 1. Accordingly, it is possible to prevent the discharging of static electricity from the user to the inside of the CF card 2 or to the slot connected to the first connector 11 through the conducting plates 70, 71.

Further, in the structure described above, the chassis 10 is formed from an insulating material, and the insulating grip portions 18L, 18R are formed by exposing the insulating material of the tip portions of the arms 17L, 17R in the extension direction thereof. Accordingly, the structure can be made simple, and the insulating grip portions 18L, 18R make it possible to reliably insulate the conducting plates 70, 71 from the user.

Further, in the structure described above, the insulating grip portions 18L, 18R are provided for a distance of at least 1 cm from the tips of the pair of arms 17L, 17R along the extending direction where the user is most likely to grip the card adapter 1.

Further, in the structure described above, at least one of the pair of conducting plates 70, 71 is provided with the connecting protrusions 75 which are adapted to make an electrical connection with the grounding means provided in the slot. Accordingly, it becomes possible to discharge the static electricity from the CF card 2 to the grounding means of the slot more reliably. Further, it becomes possible to shield the outside from undesired radiation of electromagnetic waves generated inside the device. Further, the connecting protrusions 75 are adapted to make an electrical connection with the grounding means of the slot after the first connector 11 is electrically connected to the contacts of the slot. In other words, if the connecting protrusions 75 are provided at a position on the conducting plate that come to contact with the terminals of the slot before the first connector 11 is connected to the contacts of the slot, that is at a position nearer to the top end of the conducting plate, the card adapter contacts with the grounding means to make grounding even if the card adapter is partially protruded out of the slot. This resulting in the increased risk of discharge due to the increase in the possibility that the user will touch portions of the arm cover portions 73L, 73R of the conducting plate 70 away from the insulating grip portions 18L, 18R.

Further, the card adapter 1 of the present invention can be used ideally as a card adapter for a semiconductor memory card such as a CF card or the like. Then, in the case where the card adapter 1 of the present invention is used as a card adapter for a CF card, connecting means such as the connecting members 30 or the like are provided to electrically connect the grounding contact portion 3 of the CF card 2 to at least one of the conducting plates 70, 71.

Finally, the present invention is not limited to the embodiment described above, and it is possible to make various changes and improvements without departing from the scope and spirit of the invention defined in the appended claims. For example, it is of course possible to apply the card adapter of the present invention to various other card adapters for cards manufactured under different standards than the CF card and the PC card described in the present embodiment. Examples of card-shaped electronic devices that can be used for the card adapter of the present invention include a semiconductor memory card, an interface card and a hard disk and the like.

What is claimed is:

1. A card adapter electrically connecting a plurality electrical connecting portions a card-shaped electronic device to a plurality of contacts provided in a slot receiving another card-shaped electronic device, the card adapter comprising: a first connector electrically connected to the contacts provided in the slot; a second connector which is electrically connected to the contacts provided in the slot through said first connector when the card adapter is inserted into the slot, said second connector being connected to the electrical connecting portions of the card-shaped electronic device; a chassis which said first and second connectors are disposed; a push member disposed in said chassis, said push member being movable between a first position in which the electrical connecting portions of the card-shaped electronic device are connected said second connector and a second position in which the electrical connecting portions of the card-shaped electronic device are disconnected from said second connector, and said push member pushing the card-shaped electronic device positioned at said first position toward said second position; an eject lever movably mounted in said chassis; and transmission means transmitting the movement of said eject lever to said push member.

2. The card adapter as claimed in claim 1, wherein said push member has both side portions along its width direction, and said card adapter further comprises a biasing means which always bias said side portions of the push member, respectively, from said first position toward said second position, and said push member being adapted to be displaced from said first position toward said second position by the biasing force of said biasing means.

3. The card adapter as claimed in claim 1, wherein the card-shaped electronic device is one selected from the group consisting of a semiconductor memory card, an interface card and a hard disk.

4. The card adapter as claimed in claim 1, wherein the push member is adapted to push the card-shaped electronic device with a state that the push member is in a surface contact or multi point contact with the card-shaped electronic device at the both sides from the central portion thereof.

5. The card adapter as claimed in claim 1, wherein said transmission means is rotatably mounted on said chassis by means of a rotation axis, said transmission means being formed into a link arm having one end which is linked with said push member through a first linking part and the other end which is linked with said eject lever through a second linking part so that said push member is interconnected with said eject lever.

6. The card adapter as claimed in claim 5, further comprising means for restricting a rotation angle of said link arm.

7. The card adapter as claimed in claim 5, wherein said first linking part is arranged substantially in a central part of said push member in the width direction thereof.

8. The card adapter as claimed in claim 5, wherein said rotation axis is integrally formed with said chassis.

9. The card adapter as claimed in claim 8, further comprising means for preventing said link arm from being disengaged with said rotation axis.

10. The card adapter as claimed in claim 5, wherein said first linking part comprises a projection disposed in either of said link arm or push member and an aperture disposed in the other.

11. The card adapter as claimed in claim 10, wherein said aperture is formed into a slit having a width substantially the same as the diameter of the projection so that the projection can move along the slit when the link arm is rotated.

12. The card adapter as claimed in claim 10, wherein said link arm is made of a metal plate, and said projection is integrally formed with said link arm by carrying out a burring process to a portion close to said one end of said link arm.

13. The card adapter as claimed in claim 5, wherein said second linking part comprises a linking protrusion in the other end of said link arm and a linking protrusion receiving hole formed in said eject lever so as to be engaged with said linking protrusion.

14. The card adapter as claimed in claim 13, wherein said linking protrusion is formed in the other end of said link arm through a step portion.

15. The card adapter as claimed in claim 1, further comprising means for retaining said push member at said second position when said push member has been moved to said second position.

16. The card adapter as claimed in claim 15, wherein said retaining means comprises an elastic member with a locking protrusion which is provided on said push member, and a locking aperture formed in said chassis, wherein said push member is retained at said second position by engagement between the locking protrusion and the locking aperture.

17. The card adapter as claimed in claim 16, wherein said locking protrusion is adapted to be shifted by abutment with a side surface of the card-shaped electronic device when the card-shaped electronic device is fitted to the card adapter, and the engagement between the locking protrusion and the locking aperture is disengaged so that said push member becomes displaceable toward the first position from said second position.

18. The card adapter as claimed in claim 16, wherein said chassis includes a pair of arms which are spaced apart with each other and extend from portions of said chassis which are located at opposite sides of said second connector, respectively, to define a receiving space for said card-shaped electronic device, in which said eject lever is provided in one of these arms and said elastic member is provided in the other arm.

19. The card adapter as claimed in claim 18, wherein said eject lever is provided with a cap that covers the tip end of the eject lever, and said cap is formed with a guide portion which is in abutment with the side surface of the card-shaped electronic device when the card-shaped electronic device is to be connected to said second connector.

20. The card adapter as claimed in claim 19, wherein the pair of arms includes a long arm and a short arm which is shorter than the long arm, and said eject lever is provided in the short arm.

21. The card adapter as claimed in claim 1, wherein said second connector has a plurality of contact pins, and the push member is formed with a plurality of holes through which the contact pins of the second connector protrude.

22. The card adapter as claimed in claim 21, wherein said push member exposes the contact pins of the second connector at said first position and covers the contact pins at said second position.

23. A card adapter electrically connecting a plurality electrical connecting portions a card-shaped electronic device to a plurality of contacts provided in a slot receiving another card-shaped electronic device, the card adapter comprising: a first connector electrically connected to the contacts provided in the slot; a second connector which is electrically connected to the contacts provided in the slot through said first connector when the card adapter is inserted into the slot, said second connector being connected to the electrical connecting portions of the card-shaped electronic device; a chassis which said first and second connectors are disposed; a push member disposed in said chassis, said push member being movable between a first position in which the contact pins said second connector are exposed so that the electrical connecting portions of the card-shaped electronic device are connected to said second connector and a second position in which the contact pins said second connector are covered so that the electrical connecting portions of the card-shaped electronic device are disconnected from said second connector, and said push member pushing the card-shaped electronic device positioned at said first position toward said second position; an eject lever movably mounted in said chassis; and a link arm transmitting the movement of said eject lever to said push member.

24. A card adapter electrically connecting a plurality electrical connecting portions a card-shaped electronic device to a plurality of contacts provided in a slot receiving another card-shaped electronic device which is manufactured in accordance with a different standard, the card adapter comprising: a first connector electrically connected to the contacts provided in the slot; a second connector which electrically connected to said first connector, said second connector being connected to the electrical connecting portions of the card-shaped electronic device; a chassis in which said first and second connectors are disposed; a push member disposed in said chassis, said push member being movable between a first position in which the electrical connecting portions of the card-shaped electronic device are connected to said second connector and a second position in which the electrical connecting portions of the card-shaped electronic device are disconnected from said second connector, and said push member pushing the card-shaped electronic device positioned at said first position toward said second position; an eject lever movably mounted with respect to said chassis; and transmission means transmitting the movement of said eject lever to said push member wherein said transmission means is rotatably mounted on said chassis by means of a rotation axis, said transmission means being formed into a link arm having one end which is linked with said push member through a first linking part and the other end which is linked with said eject lever through a second linking part so that said push member is interconnected with said eject lever and further wherein said first linking part comprises a projection disposed in either of said link arm or push and an aperture disposed in the other.

25. The card adapter as claimed in claim 24 wherein said aperture is formed into a slit having a width substantially the same as the diameter of the projection so that the projection can move along the slit when the link arm is rotated.

26. The card adapter as claimed in claim 24 wherein said link arm is made of a metal plate, and said projection is integrally formed with said link arm by carrying out a burring process to a portion close to said one end of said link arm.

27. A card adapter electrically connecting a plurality electrical connecting portions a card-shaped electronic device to a plurality of contacts provided in a slot receiving another card-shaped electronic device which is manufactured in accordance with a different standard, the card adapter comprising: a first connector electrically connected to the contacts provided in the slot; a second connector which electrically connected to said first connector, said second connector being connected to the electrical connecting portions of the card-shaped electronic device; a chassis which said first and second connectors are disposed; a push member disposed in said chassis, said push member being movable between a first position in which the electrical connecting portions of the card-shaped electronic device are connected said second connector and a second position in which the electrical connecting portions of the card-shaped electronic device are disconnected from said second connector, and said push member pushing the card-shaped electronic device positioned at said first position toward said second position; an eject lever movably mounted in said chassis; and transmission means transmitting the movement of said eject lever to said push member wherein said transmission means is rotatably mounted on said chassis by means of a rotation axis, said transmission means being formed into a linking arm having one end which is linked with said push member through a first linking part and the other end which is linked with said eject lever through a second linking part so that said push member is interconnected with said eject lever wherein said second linking part comprises a linking protrusion in the other end of said link arm and a linking protrusion receiving hole formed in said eject lever so as be engaged with said linking protrusion.

28. The card adapter as claimed in claim 27 wherein said linking protrusion is formed in the other end of said link arm through a step portion.

29. A card adapter electrically connecting a plurality electrical connecting portions a card-shaped electronic device to a plurality of contacts provided in a slot receiving another card-shaped electronic device which is manufactured in accordance with a different standard, the card adapter comprising: a first connector electrically connected to the contacts provided in the slot; a second connector which electrically connected to said first connector, said second connector being connected to the electrical connecting portions of the card-shaped electronic device; a chassis which said first and second connectors are disposed; a push member disposed in said chassis, said push member being movable between a first position in which the electrical connecting portions of the card-shaped electronic device are connected said second connector and a second position in which the electrical connecting portions of the card-shaped electronic device are disconnected from said second connector, and said push member pushing the card-shaped electronic device positioned at said first position toward said second position; an eject lever movably mounted in said chassis; and transmission means transmitting the movement of said eject lever to said push member and means for retaining said push member at said second position when said push member has been moved wherein said retaining means comprises an elastic member with a locking protrusion which is provided on said pushing member, and a locking aperture formed in said chassis, wherein said push member is retained at said second position by engagement between the locking protrusion and the locking aperture.

30. The card adapter as claimed in claim 29 wherein said locking protrusion is adapted to be shifted by abutment with a side surface of the card-shaped electronic device when the card-shaped electronic device is fitted to the card adapter, and the engagement between the locking protrusion and the locking aperture is disengaged so that said push member becomes displaceable toward the first position from said second position.

31. The card adapter as claimed in claim 29 wherein said chassis includes a pair of arms which are spaced apart with each other and extend from portions of said chassis which are located at opposite sides of said second connector, respectively, to define a receiving space for said card-shaped electronic device, in which said eject lever is provided in one of these arms and said elastic member is provided in the other arm.

32. The card adapter as claimed in claim 31 wherein said eject lever is provided with a cap that covers the tip end of the eject lever, and said cap is formed with a guide portion which is in abutment with the side surface of the card-shaped electronic device when the card-shaped electronic device is to be connected to said second connector.

33. The card adapter as claimed in claim 32 wherein the pair of arms includes a long arm and a short arm which is shorter than the long arm, and said eject lever is provided in the short arm.

* * * * *

UNITED STATES PATENT AND TRADEMARK OFFICE
CERTIFICATE OF CORRECTION

PATENT NO.   : 6,776,631 B2
DATED        : August 17, 2004
INVENTOR(S)  : Shimada et al.

It is certified that error appears in the above-identified patent and that said Letters Patent is hereby corrected as shown below:

Title page,
Item [73], Assignee, insert -- and -- between "Kaisha" and "Mitsumi"

Column 2,
Line 42, insert colon -- : -- after "comprising"

Signed and Sealed this

First Day of February, 2005

JON W. DUDAS
*Director of the United States Patent and Trademark Office*